US012693325B2

(12) United States Patent
Shivaram et al.

(10) Patent No.: US 12,693,325 B2
(45) Date of Patent: Jul. 28, 2026

(54) SYSTEM AND METHOD FOR DETERMINING PROBE SKEW

(71) Applicant: Tektronix, Inc., Beaverton, OR (US)

(72) Inventors: Vivek Shivaram, Bengaluru (IN);
Niranjan R Hegde, Siddapur (IN);
Shubha B, Bengaluru (IN); **Krishna N
H Sri, Bengaluru (IN); Yogesh M. Pai**,
Bengaluru (IN); **Venkatraj
Melinamane**, Bengaluru (IN)

(73) Assignee: Tektronix, Inc., Beaverton, OR (US)

( * ) Notice: Subject to any disclaimer, the term of this patent is extended or adjusted under 35 U.S.C. 154(b) by 167 days.

(21) Appl. No.: 18/220,222

(22) Filed: Jul. 10, 2023

(65) Prior Publication Data

US 2024/0027513 A1      Jan. 25, 2024

(30) Foreign Application Priority Data

Jul. 14, 2022    (IN) ............................ 202221040422

(51) Int. Cl.
*G01R 31/26*         (2020.01)

(52) U.S. Cl.
CPC ................................ *G01R 31/2608* (2013.01)

(58) Field of Classification Search
CPC ............ G01R 31/2608; G01R 31/2633; G01R
31/3191; G01R 19/2509; G01R 31/31709;
G01R 31/088; G01R 29/26; G01R 31/11;
G01R 31/31725; G01R 31/31718; G01R
23/02; G01R 23/16; G01R 29/023; G01R
31/001; G01R 31/31922; G01R 31/2882;
G01R 31/31937; G01R 31/318328; H03K
5/1502; H03K 5/19; H03K 5/1508; G06F
16/254; G06F 1/10; G06F 2119/12; G06F
30/3312; G06F 11/1687; G06F 11/1679
See application file for complete search history.

(56) References Cited

U.S. PATENT DOCUMENTS

| | | | | |
|---|---|---|---|---|
| 4,439,858 | A * | 3/1984 | Petersen .......... | G01R 31/31915 714/740 |
| 4,931,723 | A * | 6/1990 | Jeffrey ............. | G01R 31/31922 714/743 |

(Continued)

OTHER PUBLICATIONS

Zheya Zhang, et al., Methodology for Wide Band-Gap Device Dynamic Characterization, IEEE Transactions on Power Electronics, Dec. 2017, pp. 9307-9318, vol. 32, No. 12, IEEE, Piscataway, NJ, USA.

(Continued)

*Primary Examiner* — Vinh P Nguyen
(74) *Attorney, Agent, or Firm* — Miller Nash LLP; Andrew J. Harrington

(57)           ABSTRACT

A system for determining an amount of time skew between two measurement probes includes a first probe and a second probe and one or more processors configured to measure a current signal from a Device Under Test (DUT) through the first probe, measure a voltage signal from the DUT through the second probe, generate a modeled voltage signal from the measured current signal, compare the modeled voltage signal to the measured voltage signal, and determine the amount of time skew between the first and the second probe from the compared signals. Methods are also described.

23 Claims, 16 Drawing Sheets

(56) References Cited

U.S. PATENT DOCUMENTS

| | | | | |
|---|---|---|---|---|
| 4,994,732 | A * | 2/1991 | Jeffrey | G01R 31/31921 |
| | | | | 324/73.1 |
| 7,463,015 | B2 * | 12/2008 | Mende | G01R 1/06788 |
| | | | | 324/754.01 |
| 7,724,017 | B2 * | 5/2010 | Zhao | G01R 31/2621 |
| | | | | 324/762.01 |
| 8,400,179 | B1 * | 3/2013 | Hulbert | G01R 31/2837 |
| | | | | 324/762.01 |
| 10,782,348 | B2 * | 9/2020 | Sobolewski | G01R 31/31908 |
| 11,067,629 | B2 * | 7/2021 | Weimer | G01R 31/3167 |
| 11,428,732 | B2 * | 8/2022 | Brush | G01R 13/0254 |
| 11,705,894 | B2 * | 7/2023 | Sobolewski | G01R 31/2831 |

OTHER PUBLICATIONS

Fei Wang et al., Characterization of Wide Bandgap Power Semiconductor Devices, Oct. 31, 2018, pp. 165-205, Chapter 8, The Institution of Engineering and Technology, Stevenage, United Kingdom.

* cited by examiner

Figure 2A:
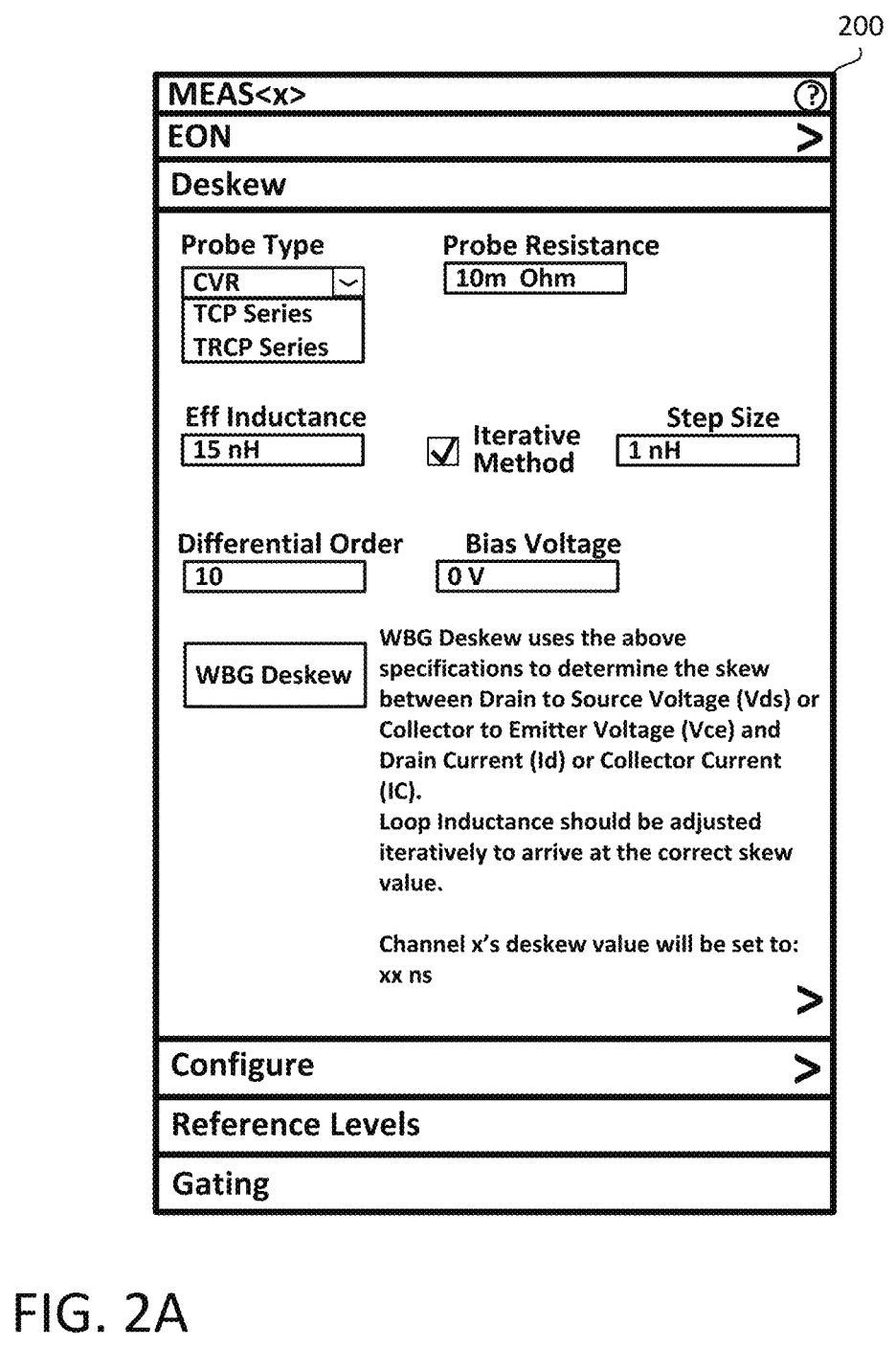

200

| MEAS<x> | ⑦ |
|---|---|

| EON | > |
|---|---|

Deskew

Probe Type
CVR ⌄
TCP Series
TRCP Series

Probe Resistance
10m Ohm

Eff Inductance
15 nH

☑ Iterative Method

Step Size
1 nH

Differential Order
10

Bias Voltage
0 V

WBG Deskew

WBG Deskew uses the above specifications to determine the skew between Drain to Source Voltage (Vds) or Collector to Emitter Voltage (Vce) and Drain Current (Id) or Collector Current (IC).
Loop Inductance should be adjusted iteratively to arrive at the correct skew value.

Channel x's deskew value will be set to: xx ns

>

| Configure | > |
|---|---|

| Reference Levels | |
|---|---|

| Gating | |
|---|---|

| MEAS<x> | ⑦ |

| EON | > |

| Deskew | > |

Configure

Pulse Region
| Second Pulse ⌄ |

Label
| Eon |

Voltage Source (Vds)
| Ch1 ⌄ |

Current Source (Id)
| Ch2 ⌄ |

Gate Source (Vgs)
| Ch3 ⌄ |

Levels
| Auto | Custom |

Set Levels in
| % | Absolute |

☑ Refine Edge

Start Level
| Vds | Id | Vgs |
| A | 10% |

Stop Level
| Vds | Id | Vgs |
| B | 90% |

Start Search Direction
| Forward | Backward |

Stop Search Direction
| Forward | Backward |

| Reference Levels | > |

| Gating | > |

SYSTEM AND METHOD FOR DETERMINING PROBE SKEW

CROSS-REFERENCE TO RELATED APPLICATIONS

This disclosure claims priority under 35 U.S.C. § 119 to Indian Provisional Patent Application No. 202221040422, filed Jul. 14, 2022, titled "AN AUTOMATED DE-SKEW SYSTEM AND METHOD FOR HIGH VOLTAGE SEMICONDUCTORS," the disclosure of which is incorporated herein by reference in its entirety.

TECHNICAL FIELD

The present disclosure relates to an automated de-skew system and method for high voltage semiconductors.

BACKGROUND

Semiconductor materials used in power electronics are transitioning from silicon to Wide Band Gap (WBG) semiconductors, such as silicon carbide (SiC) and gallium nitride (GaN). This change in material is due to the superior performance of WBG semiconductors at higher power levels, which is increasing their adoption for automotive and industrial applications. Measuring the switching parameters of metal-oxide-semiconductor field-effect transistor (MOSFETs) or insulated-gate bipolar transistor (IGBTs) is commonly performed using the Double Pulse Test (DPT) method. In this method, two pulses are applied on the gate of the device at separate times in an inductive clamp circuit. The Double Pulse Testing is performed with active current and differential voltage probes. Each probe has its own characteristic propagation delay contributing to varying delays in simultaneous acquisition of current and voltage. This delay between a set of probes during concurrent acquisition is known as time "skew." It is important that this delay between the probes be compensated prior to testing in a process known as "de-skewing" the probes to eliminate or minimize any time misalignment between the probes. Otherwise, the timing skew could result in imprecise measurements and calculations based on such imprecise measurements.

One issue specific to WBG testing is that conventional de-skew methods have limited operating voltage levels that are too low for the levels needed to test WBG materials. De-skewing with these limited voltage levels may cause inaccurate results if actual WBG tests are run at typical voltage levels for testing WBG materials. Further, although shunt resistors are used in WBG double pulse testing, there is no way to easily quantify skew in shunt resistors, since at present only coaxial probes are typically calibrated.

Another issue with present de-skewing methods is that de-skewing is a manual process, controlled by the user. In the conventional de-skew process, a user sets up a test bench and performs preliminary measurements using each probe. When an apparent event in the test setup occurs, such as a transistor turning on or off, both the current probe and voltage probe detect the event and their traces are shown on a display, such as an oscilloscope. Then the user manually measures the horizontal distance on the screen between the two events to determine the skew between the probes. After the skew is determined, the user manually enters the value in a de-skew setup screen. The instrument then compensates one or both of the measurements through the probes by the compensated de-skew amount, so that their measurements are aligned. Such manual measurement and subsequent de-skewing, however, is prone to human errors, and may be inaccurate if, for example, signals are acquired at low sample rates or with limited scope bandwidth. Further, characteristics in high frequency component patterns may be missed, or obscured by noise in the voltage or current waveform. In other words, for a variety of reasons, the manual de-skewing process is prone to error.

Another problem with de-skewing WBG testing platforms is illustrated in FIG. 1, which shows a typical DPT testing setup 100 for two WBG transistors. Some WBG manufacturers replace inductor (L) of testing setup 100 with a pure resistor. This replacement has a number of disadvantages, including altering the measurement circuit by adding to phase shift of the tested waveform, not being cost effective, requiring additional setup time, introducing maximum voltage limits, and decreasing the quality of the de-skew measurements. Further, this particular method limits the measured skew value to a particular evaluation board. Thus, for a variety of reasons, de-skewing using the inductor replacement method is problematic.

Embodiments according to this disclosure address these issues with conventional testing systems.

BRIEF DESCRIPTION OF ACCOMPANYING DRAWINGS

FIGS. 2A and 2B illustrate user de-skew and configuration interfaces for a measurement instrument including an automated de-skewing process according to embodiments of the disclosure.

Figure 6:
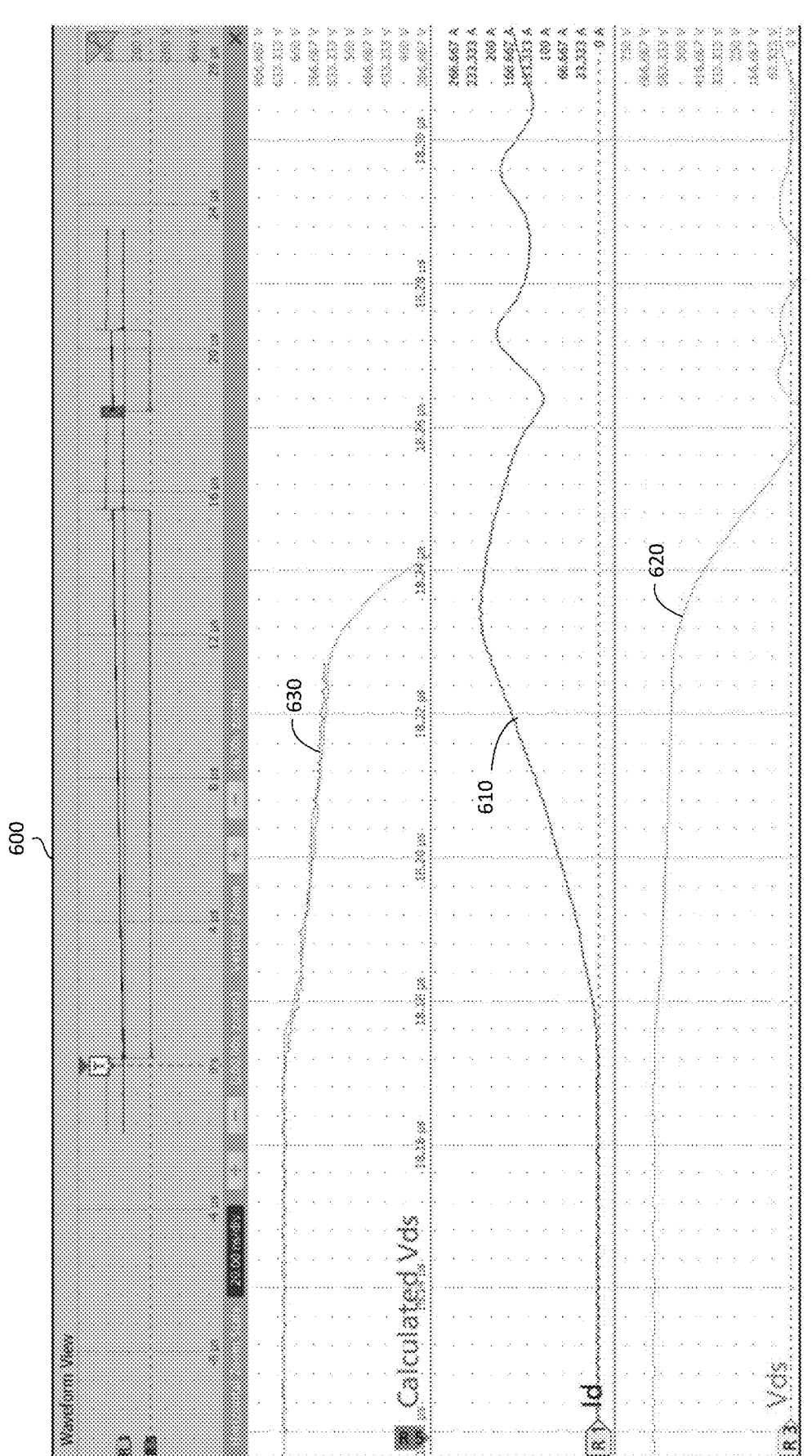

FIG. 6. is an example screen illustrating a statistically modeled Vds, along with a measured Id and measured Vds used for automatically determining skew amounts, according to embodiments of the disclosure.

Figure 7:
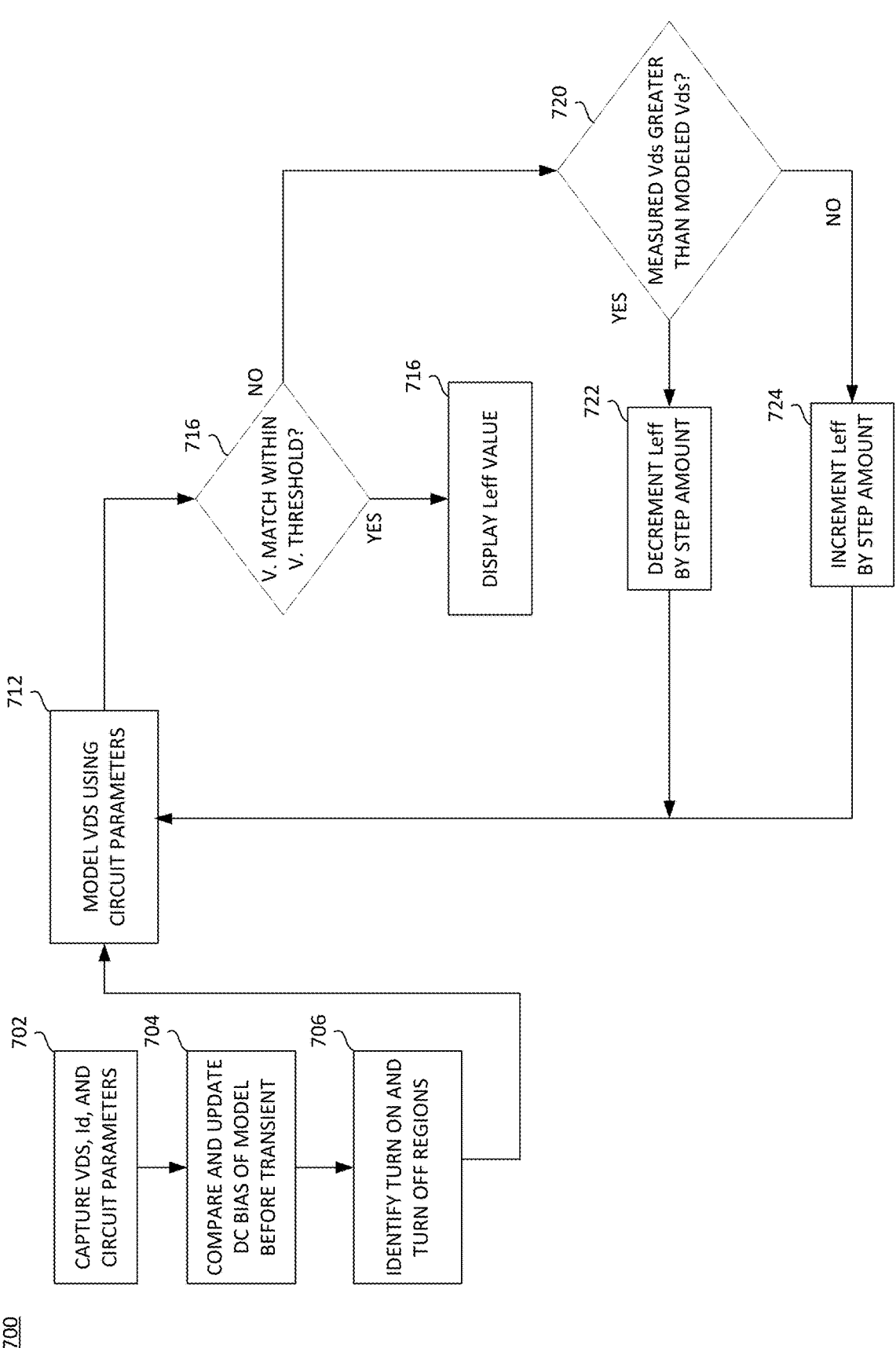

FIG. 7 is a flowchart illustrating example operations to find an effective power loop inductance, according to embodiments of the disclosure.

Figure 8:
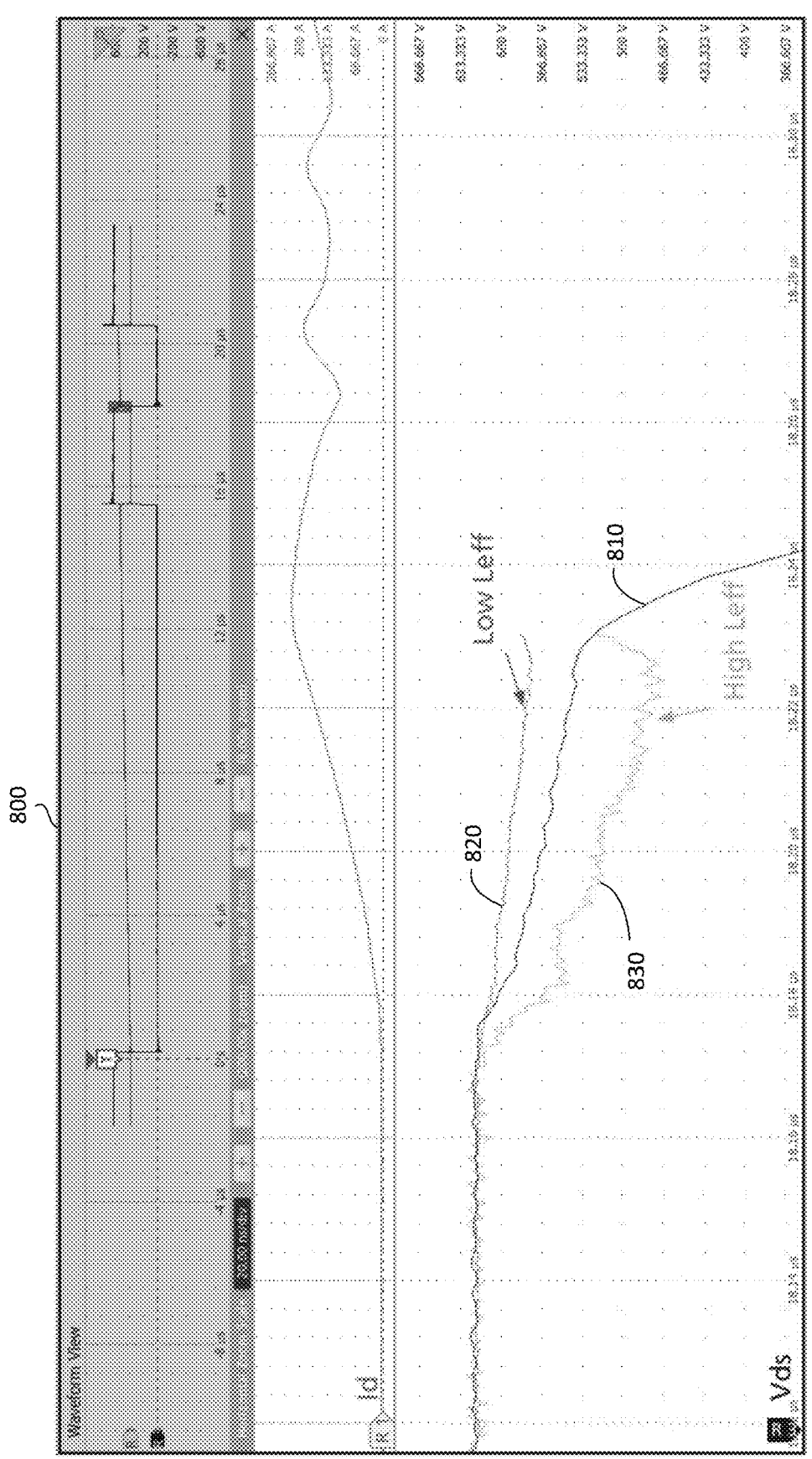

FIG. 8 is an example screen illustrating a measured Id as well as a statistically modeled Vds using various effective inductances during a turn ON transient, according to embodiments of the disclosure.

Figure 9:
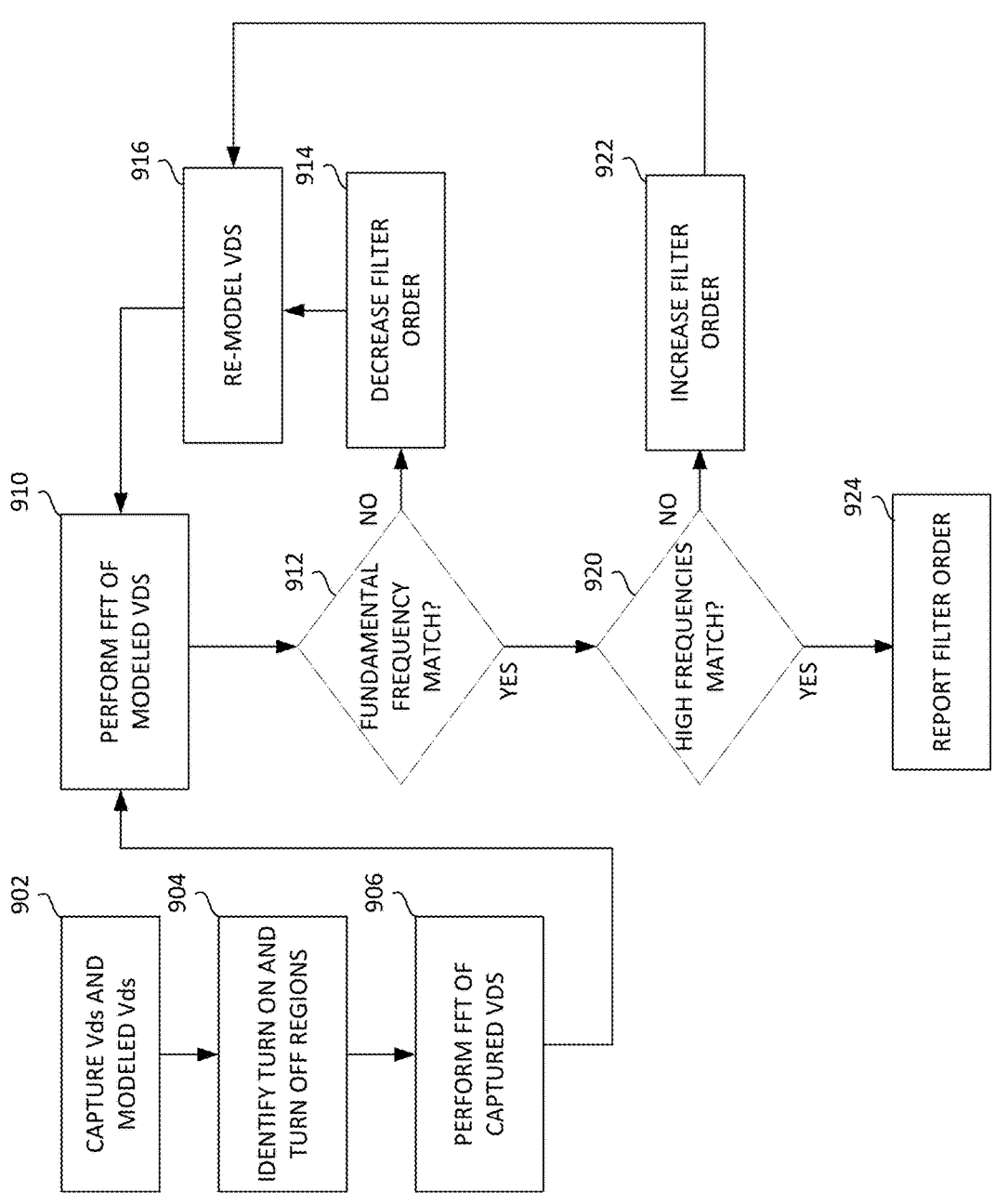

FIG. 9 is a flowchart illustrating example operations to accurately find the order of a differential filter in the Vds model, according to embodiments of the disclosure.

Figure 10A:
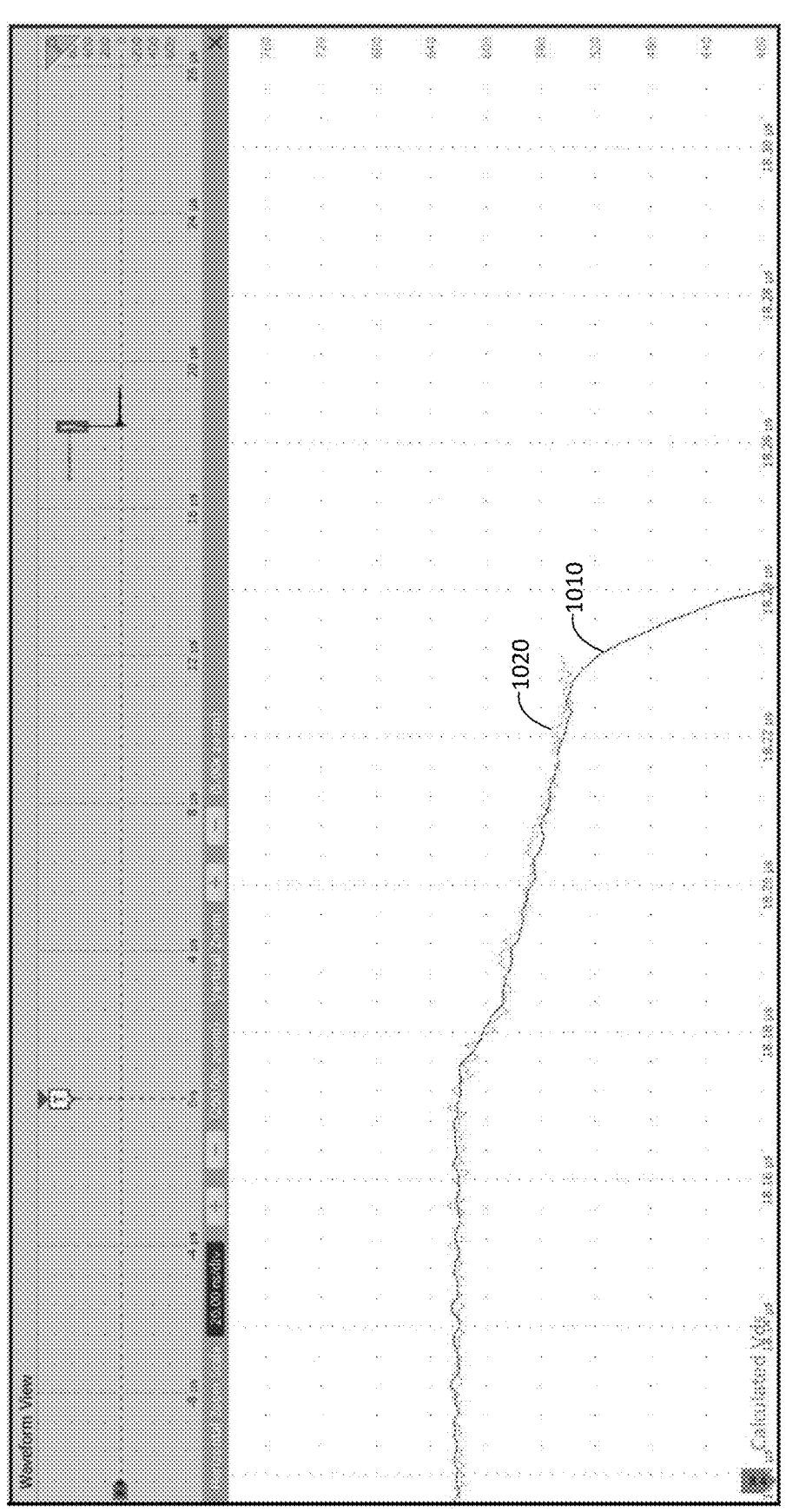
Figure 10B:
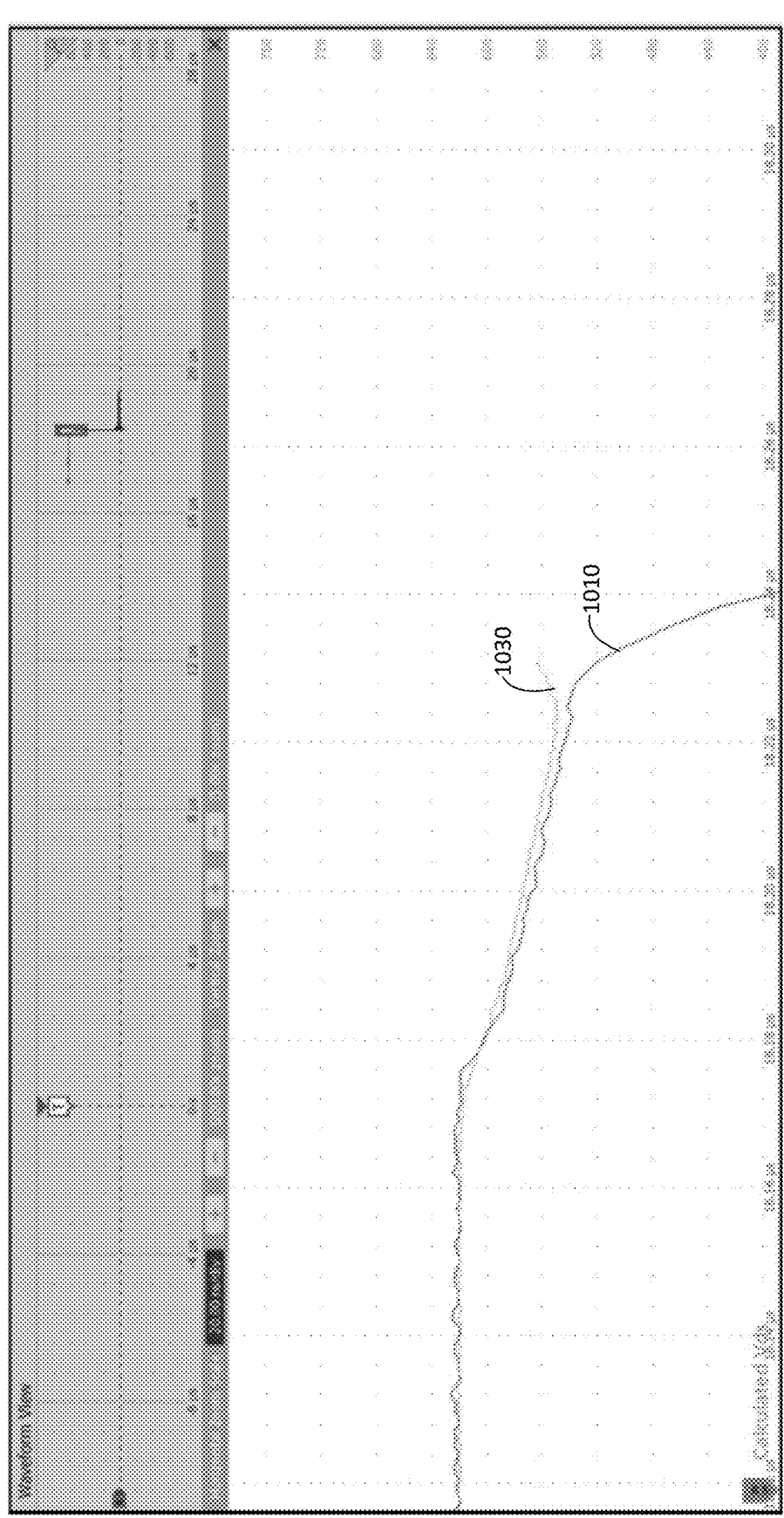
Figure 10C:
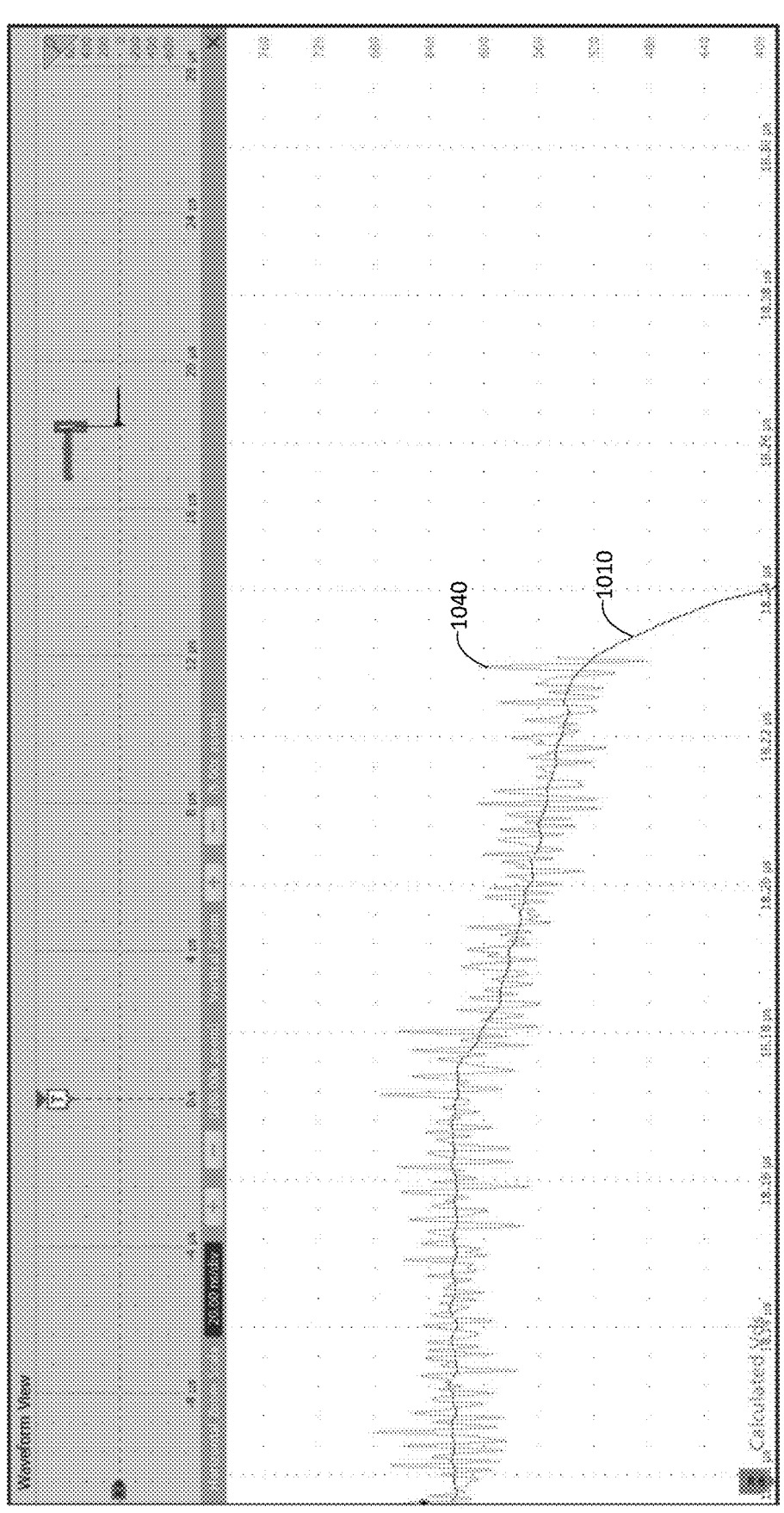

FIGS. 10A, 10B, and 10C are example screens illustrating the effects of different orders of filters at a turn-ON transient, according to embodiments of the disclosure.

Figure 11:
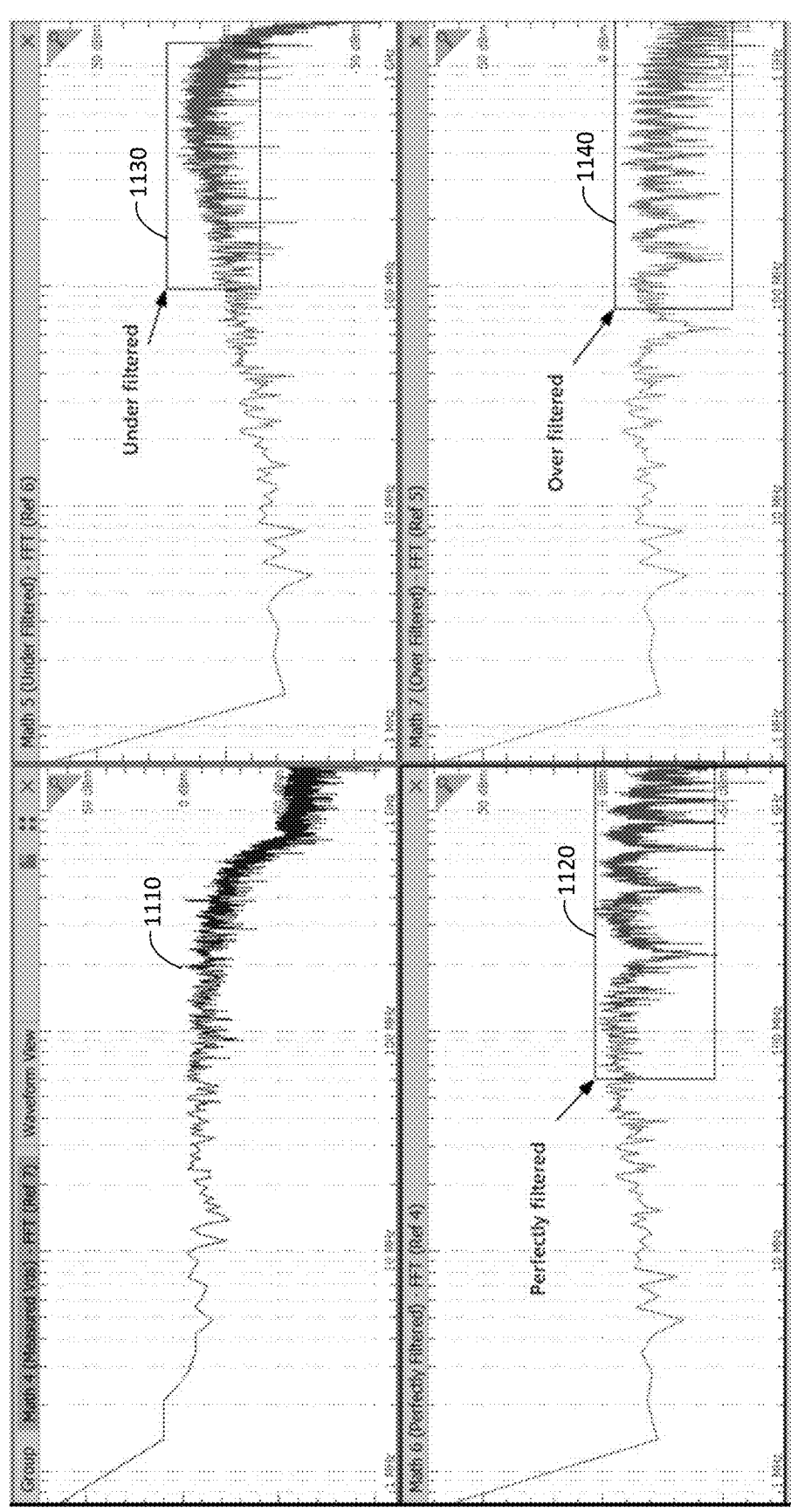

FIG. 11 are example screens illustrating the effects of different orders in a differential filter to model Vas according to embodiments of the disclosure.

Figure 12:
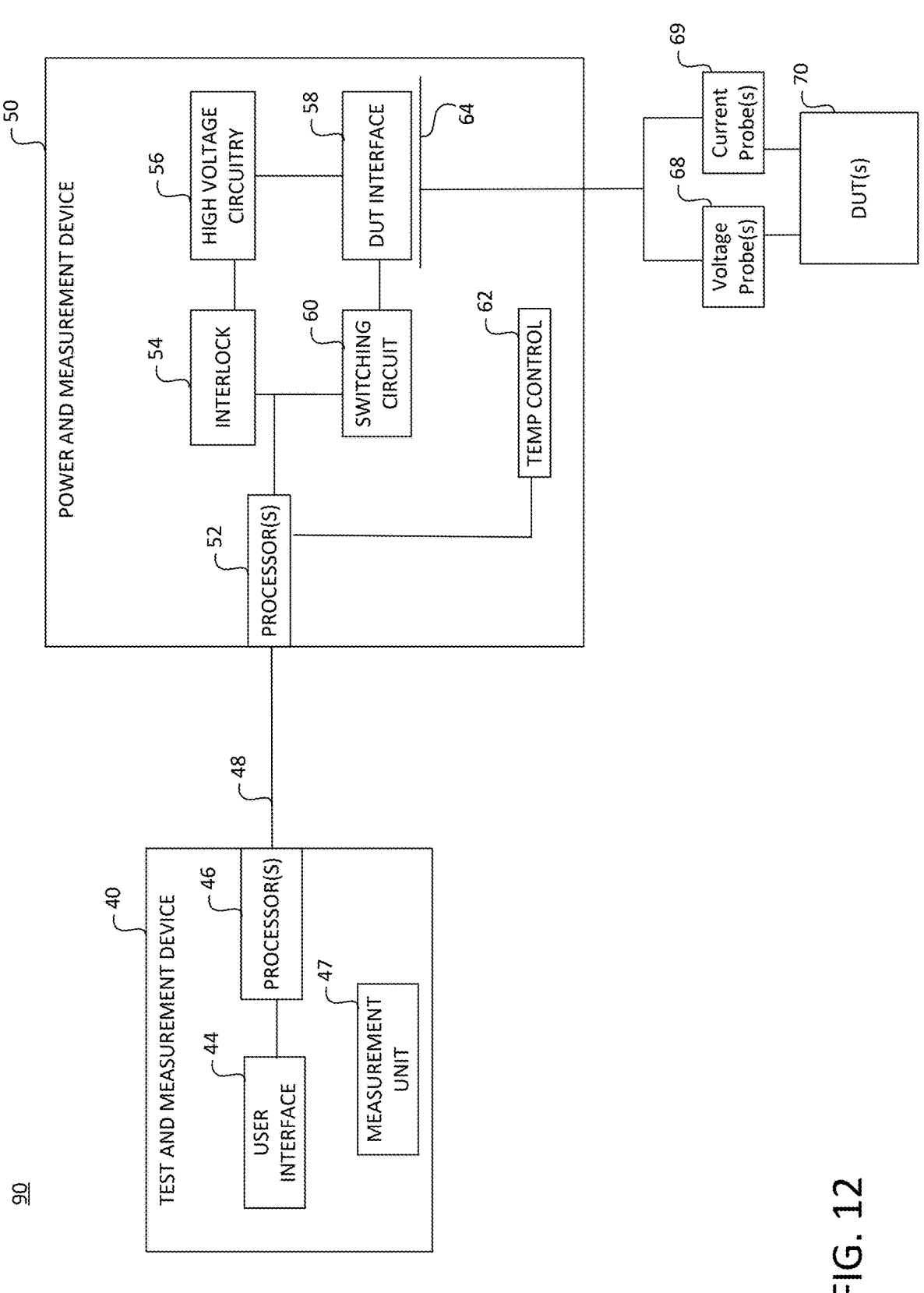

FIG. 12 is a functional block diagram illustrating an environment within which embodiments of the disclosure operate.

DETAILED DESCRIPTION

The various embodiments of the present disclosure describe an automated de-skew system and method for high voltage semiconductors, which can reduce measurement probe de-skewing processing time from hours to minutes.

In the following description, for purpose of explanation, specific details are set forth in order to provide an understanding of the present disclosure. It will be apparent, however, to one skilled in the art that the present disclosure may be practiced without these details. One skilled in the art will recognize that embodiments of the present disclosure, some of which are described below, may be incorporated into a number of systems.

FIGS. 2A and 2B illustrate example user interfaces for a measurement instrument including an automated de-skewing process. A context panel 200 includes entry fields through which a user enters circuit parameters of the testing environment. For example, the user may select a probe type in a dropdown screen. The automated de-skewing procedure described herein may be used with current shunt measurement probes such as Current Viewing Resistor (CVR) probes as well as isolated, e.g. hall effect, transformer-based, or Rogowski coil-based, current probes like TCP and TRCP series probes available from Tektronix, Inc. of Beaverton, Oregon, and equivalent probes. The TRCP probe differs from the TCP probe in that the TRCP probe uses a Rogowski coil. Based on the type of probing, probe resistance and loop inductances are considered in the automatic de-skewing process described herein.

The user enters additional parameters of the setup through the context panel 200 as well, such as probe resistance, bias voltage, differential order, and effective inductance. If the user selects the de-skew to be automatically determined using an iterative method, described below, the user is also prompted to input a step size used for each testing iteration. In the example shown in FIG. 2A, the user has entered a step size of 1 nH. FIG. 2B illustrates additional configuration details for operating the instrument, such as assigning particular channels for measurement, search direction start/stop levels. There may be other test parameters for the testing setup not illustrated in FIG. 2A or 2B for other, typical, operations of the test instrument. For example, the user will typically acquire Double Pulse Test (DPT) signals from a testing setup such as testing setup 100 (FIG. 1) and provide the circuit parameters to the instrument for calculating skew between current and voltage. It is also beneficial to set the dc offset and vertical scale of the assigned measurement channel(s) to fill the entire oscilloscope screen during the di/dt transient time interval.

When the parameters described above have been entered, the user presses the WBG De-skew button in context screen 200 to start an automated process to determine skew between the current and voltage probes and compensate the instrument for such skew. Although described in more detail below, in general, the instrument uses the entered parameters to compute a statistical model of voltage waveform, determines a skew value at particular turn on/turn off transients of the WBG device being tested, and then outputs the skew value to the user for visual confirmation. If the iterative method is chosen, the instrument automatically determines the skew value, and potentially the effective inductance value of the power loop using iterative methods. The process also matches the acquired waveform with the generated statistical model and configures the final skew value to the channel acquisition system. With voltage and current de-skewed, measurements can be done on same acquired waveform that was used to determine the skew.

Figure 3:
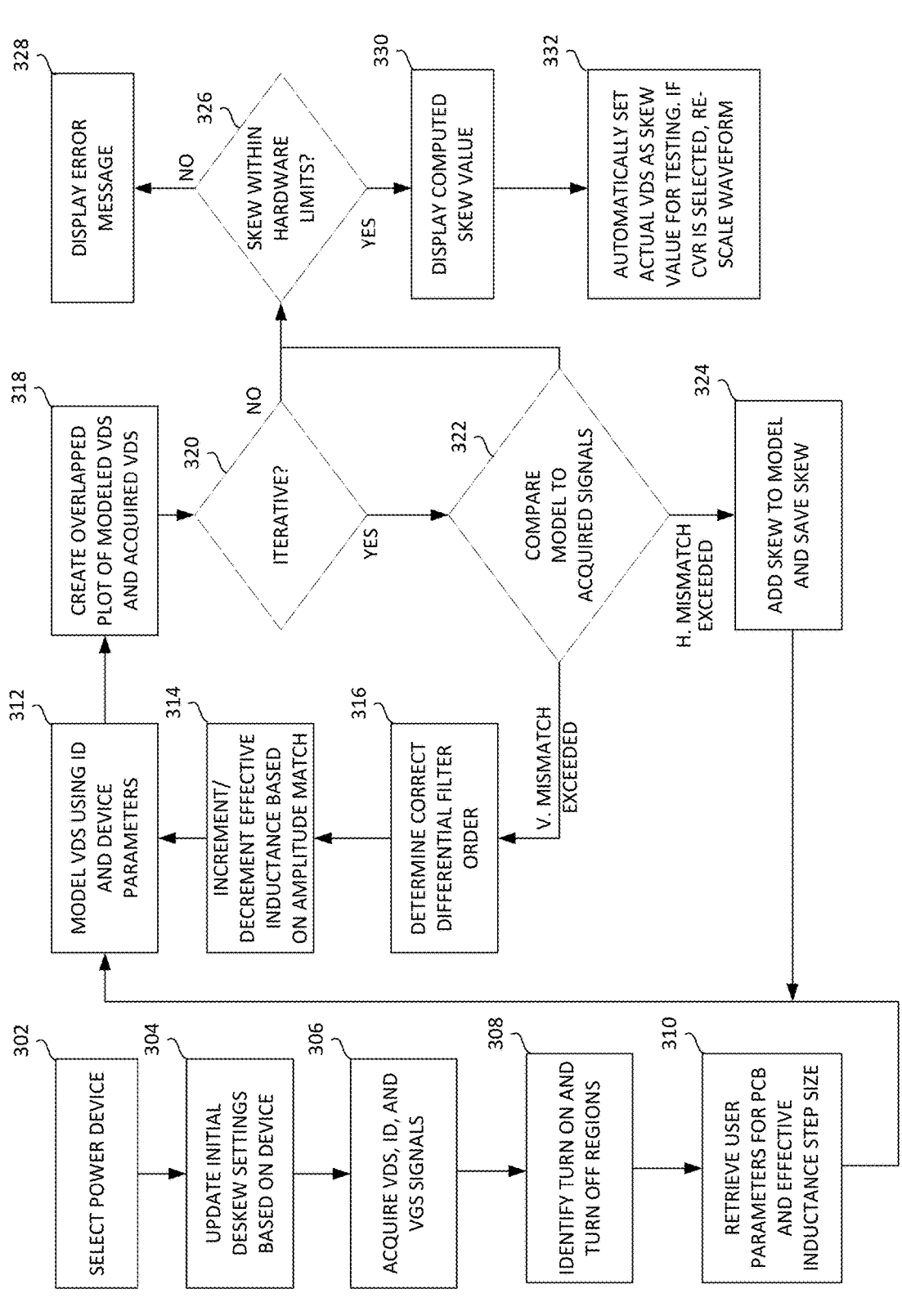
FIG. 3 is a flowchart illustrating example operations to find skew between probes using Ia. and Vas according to embodiments of the disclosure.

FIG. 3 is a flowchart illustrating example operations in a flow 300 to find skew using $I_d$ and $V_{ds}$ measurements according to embodiments of the disclosure. Initially, in an operation 302, the user selects which type of power device, such as SiC or GaN, is being tested. Then, operation 304 initiates settings based on the selected device type. In some examples, the GaN devices may include GaN-HEMT, Vertical GaN, and GaN-cascode.

Figure 1:
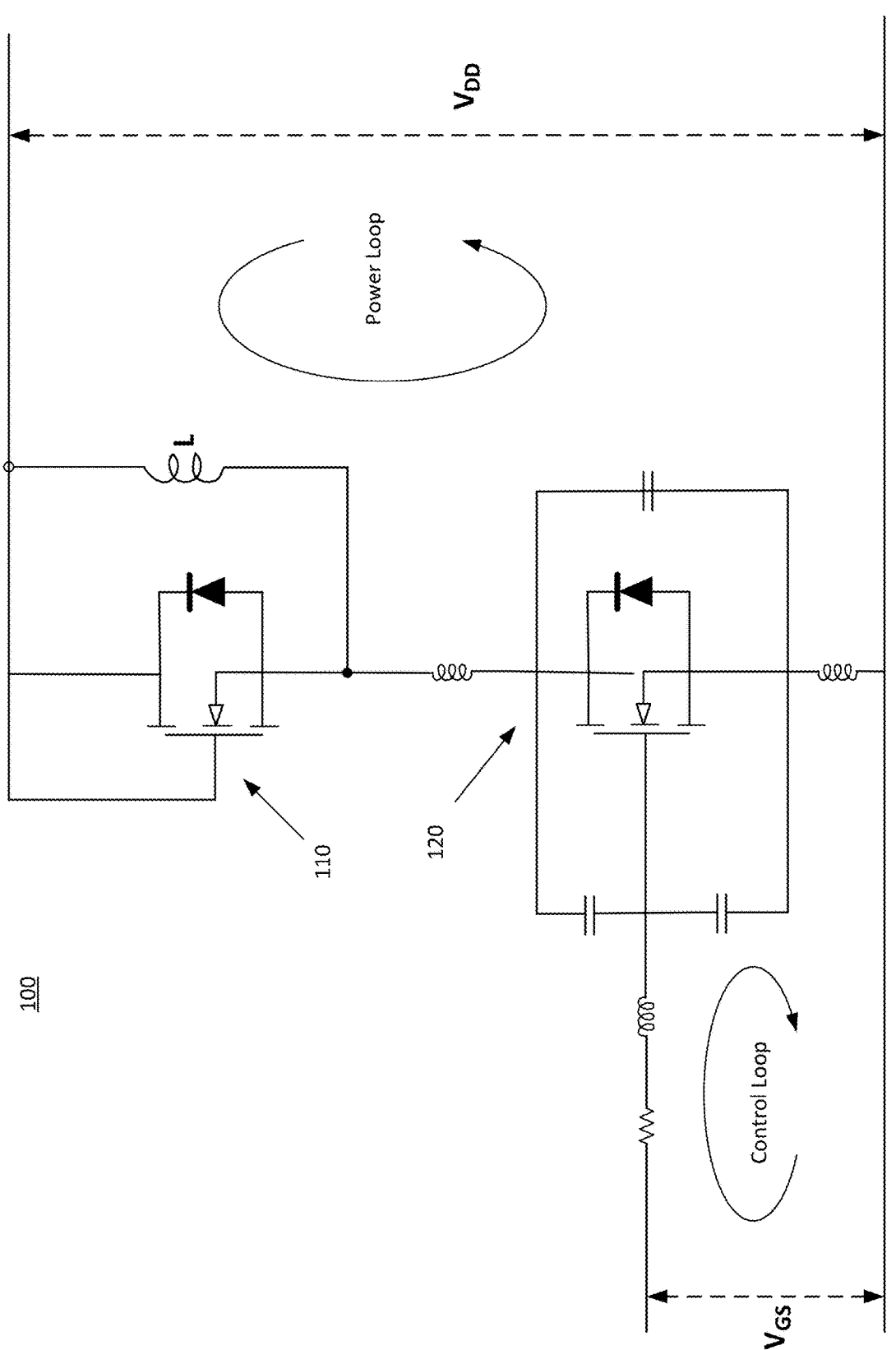
FIG. 1 shows a double pulse testing platform and circuit for WBG devices upon which embodiments of the disclosure may operate.

Next, the WBG testing platform, such as the platform 100 of FIG. 1 is energized and DPT pulses are sent to the device or devices being tested. In FIG. 1, two MOSFET devices, 110, 120 are the WBG devices being tested, although other types of WBG devices may be tested in other embodiments. As the pulses are delivered to the MOSFET devices 110, 120, measurement signals are acquired from the devices in an operation 306, such as drain-source voltage (Vds), drain current (Id), and gate-source voltage (Vgs) signals. Once these measurement signals are acquired, the instrument performs threshold or other analysis on the signals to identify Turn-ON and Turn-OFF regions of the devices in an operation 308. In other words, the instrument determines when the measured devices turned ON, and when the measured devices turned OFF, based on the measured signals.

After the Turn-ON and Turn-Off regions have been identified, the instrument retrieves the parameters introduced by the user in a process 310. For instance, the instrument retrieves the parameters that were entered by the user from the context panel 200, or other parameters.

Figure 4A:
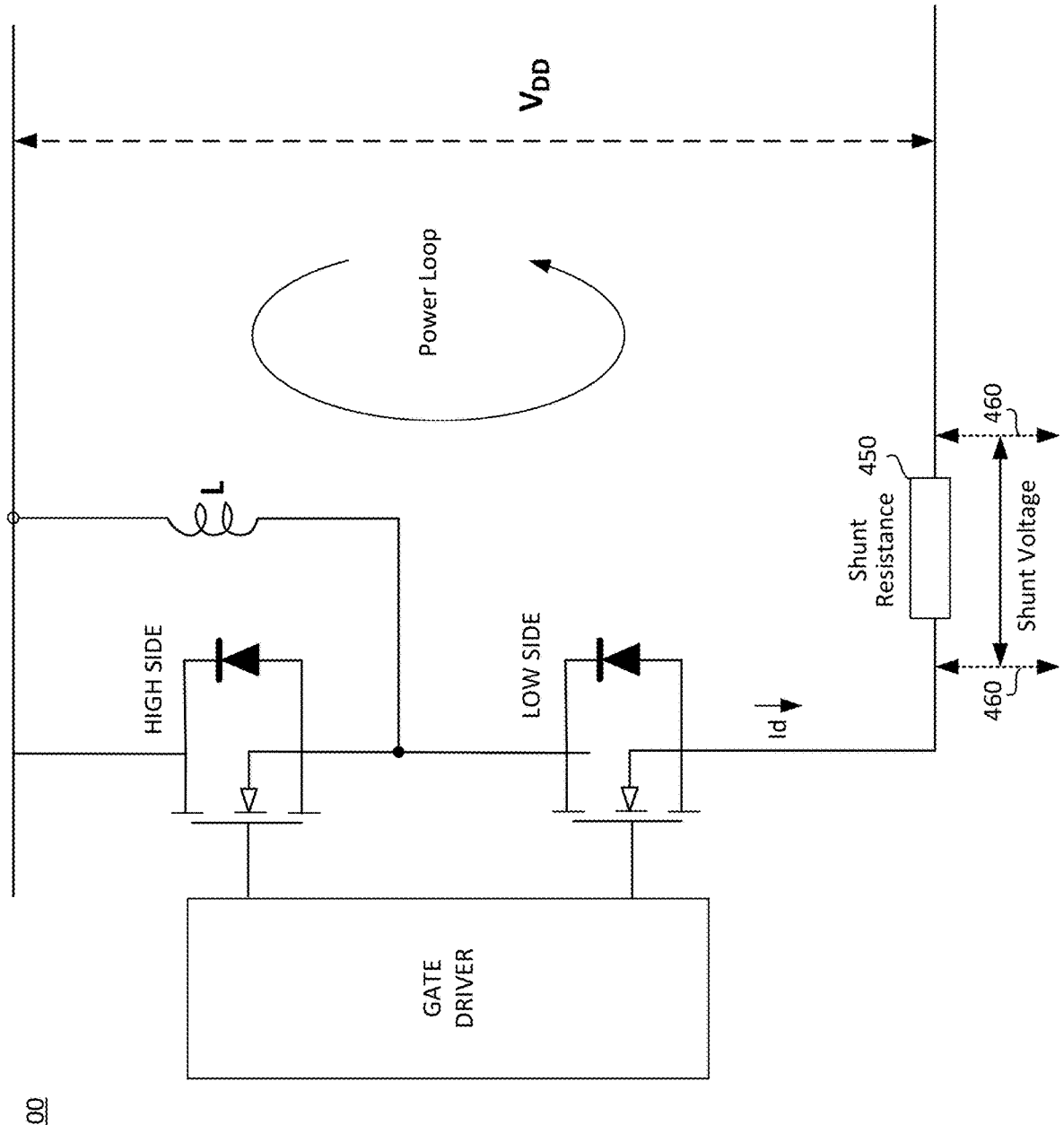
FIG. 4A is a circuit diagram of a typical DPT circuit used for modeling when CVR probes are used with a testing platform, according to embodiments of the disclosure.
Figure 4B:
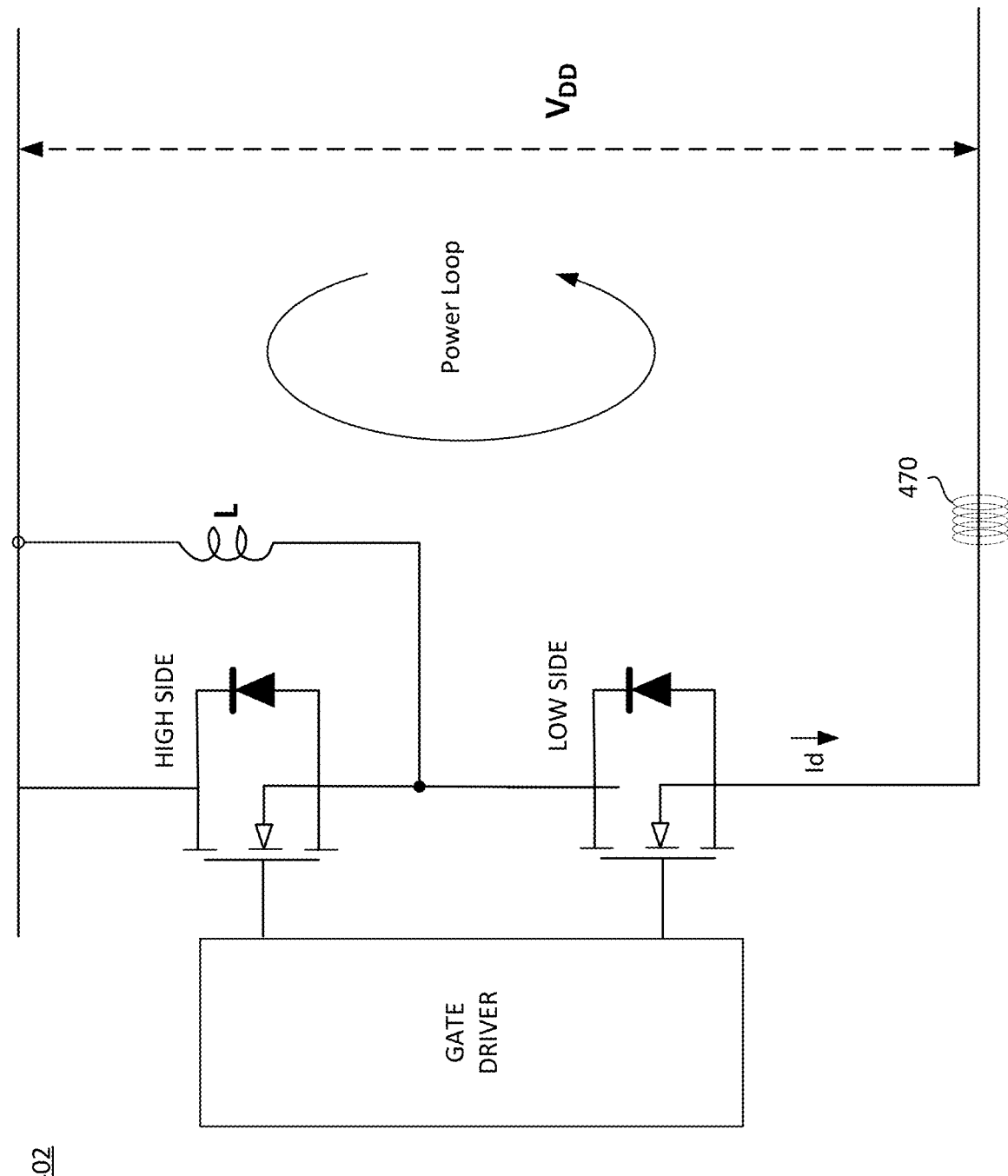
FIG. 4B is a circuit diagram of a typical DPT circuit used for modeling when TCP or TRCP probes are used with a testing platform, according to embodiments of the disclosure.

Next, in an operation 312, the instrument generates a model Vds from the measured drain current, Id, as well as the parameters retrieved in the operation 310. The drain voltage can be modeled during any time of the switching transient determined in the operation 308 using Kirchhoff s Voltage law (KVL). FIG. 4A shows a DPT testing circuit 400 used for modeling CVR type probes, which includes a shunt resistance 450 across which a differential voltage probe 460 measures a shunt voltage. FIG. 4B is a DPT testing circuit 402 used for modeling TCP or TRCP type probes, which uses output from a TCP or TRCP probe to measure drain current Id. Unlike DPT testing circuit 400 of FIG. 4A, in the DPT testing circuit 402 of FIG. 4B, there is a negligible amount of shunt resistance, and instead the inductance 470 represents the inductor impedance from the TCP or TRCP probe.

Equation (1) below is derived by applying KVL to the typical testing circuits as shown in FIGS. 4A and 4B.

$$V_{ds\_low} + V_{ds\_high} + I_d * R_{probe} + L_{eff} * \frac{dI_d}{dt} = V_{DD} \qquad \text{(Equation 1)}$$

where $R_{probe}$ is the resistance of probe used for measuring current, $L_{eff}$ is the effective inductance as measured at power loop inductance which is illustrated in the FIG. 4A, and $V_{DD}$ is the DC bus voltage. During usual operation, $V_{ds\_low}$ and $V_{ds\_high}$ are complicated to model statistically but at turn on/off transitions one of these voltages are clamped by body diode. Thus, it is possible to generate a statistical model at one of the transitions. An equivalent circuit 500 is modeled as illustrated in FIG. 5, which shows a simplified DPT circuit 500 during the turn-on transient, according to an exemplary implementation of the present disclosure.

Figure 5:
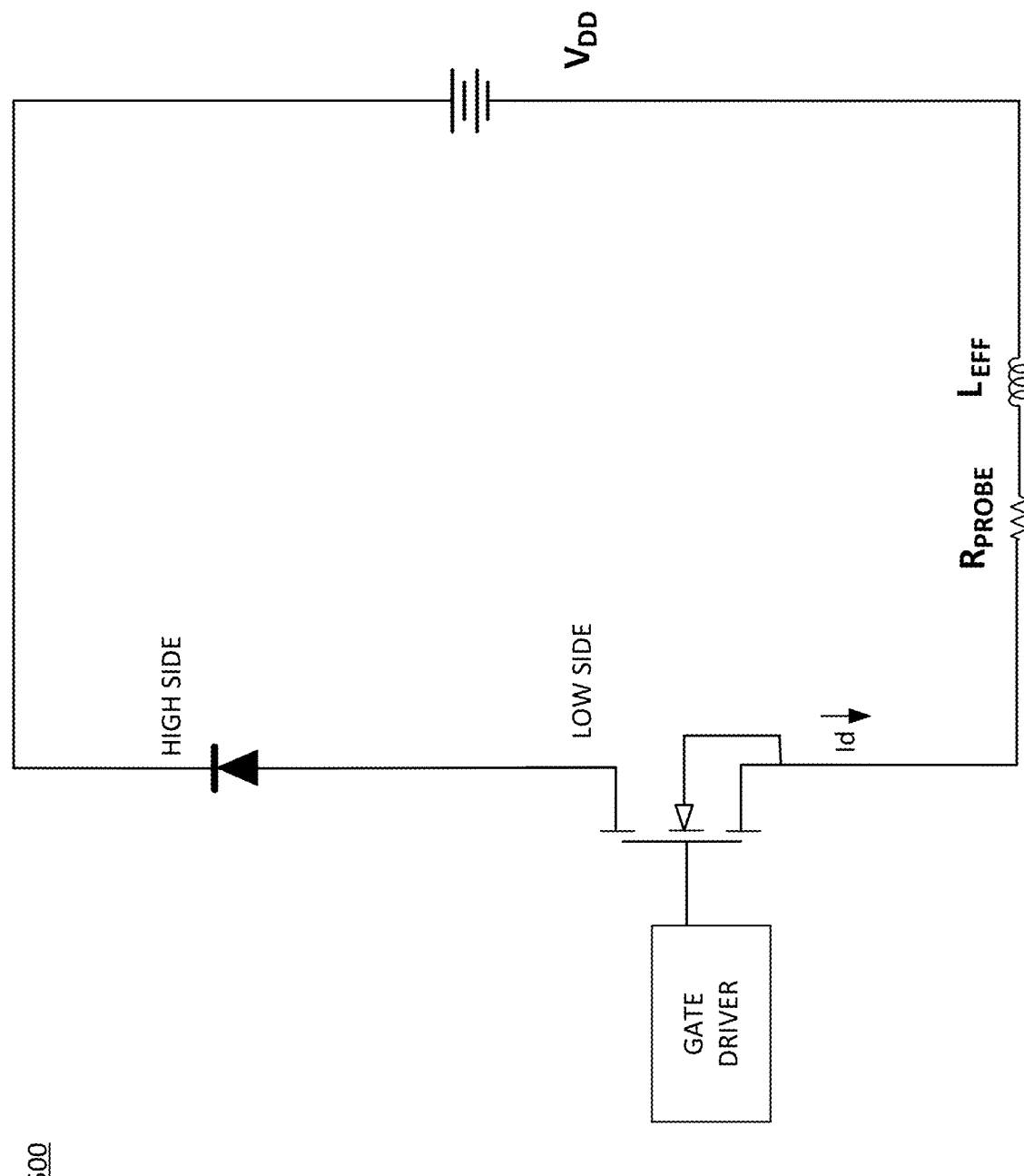
FIG. 5 is a circuit diagram of a simplified DPT circuit used for modeling during a device turn ON transient, according to embodiments of the disclosure.

On applying KVL to the model DPT circuit 500 of FIG. 5, $V_{ds\_low}$ ignoring capacitive effects can be modelled as shown in Equation (2).

$$V_{ds\_low} = V_{DD} - V_{hsbf} - I_d * R_{probe} - L_{eff} * \frac{dI_d}{dt} \qquad \text{(Equation 2)}$$

where $V_{hsbf}$ is the high side body diode forward drop. $V_{DD}$ and $V_{hsbf}$ can be grouped as the effective bias voltage for the low side Mosfet ($V_{eb}$), which is constant at the turn-on transient. Hence, the low side $V_{ds}$ will be a function of $I_d$ and $dI_d/dt$, as shown in Equation (3).

$$V_{ds\_low} = V_{eb} - I_d * R_{probe} - L_{eff} * \frac{dI_d}{dt} \qquad \text{(Equation 3)}$$

To accurately model $V_{ds\_low}$ using Equation 3, $R_{probe}$ and $L_{eff}$, shown in FIG. 5, should be of fitting values. $R_{probe}$ depends on the method of probing used for current measurement, which is specified by the user in FIG. 2A. If the current shunt resistor 450 as shown in FIG. 4A is used to measure current, the resistance of probing can be found using the data sheet parameters of the current shunt resistor. If a TCP or TRCP probe with isolation is used instead, as illustrated in FIG. 4B, the resistance of probing can be ignored as measurement is based on hall effect.

The Equation for current shunt resistor probing method is:

$$V_{ds\_low} = V_{eb} - I_d * R_{shunt} - L_{eff} * \frac{dI_d}{dt} \qquad \text{(Equation 4)}$$

The Equation for isolated current probing or TRCP method is:

$$V_{ds\_low} = V_{eb} - L_{eff} * \frac{dI_d}{dt} \qquad \text{(Equation 5)}$$

If $L_{eff}$ is known beforehand to the modeling system, i.e., if it has been entered into the context panel 200, or known from another process, it can be given as input to equation. In some cases, the $L_{eff}$ value is not known, and may be difficult to determine. Embodiments according to this disclosure provide an automated method for determining the $L_{eff}$ value, which is described in detail below with reference to FIGS. 7 and 8.

Returning back to FIG. 3, once the Vds has been modeled in the operation 312, using the model circuits and equations described above, the instrument creates an overlapped plot of the Vds modeled in the operation 318 to the actual Vds that was measured in the operation 306. An example display screen 600 of FIG. 6 illustrates example measured signals Id 610, Vds 620, and the Vds 630 that were calculated or modeled in the operation 312. In practice, the display screen 600 may or may not be shown to the user, depending on implementation details.

If the "iterative method" box of the context panel 200 of FIG. 2A was chosen by the user, the generated Vds model illustrated in FIG. 6 is compared to the measured Vds in an operation 322 (FIG. 3). In practice, the horizontal alignment is found using cross-correlation in the instrument between the statistical model generated in the operation 312, and the waveform acquired in operation 306. A horizontal mismatch of the generated versus measured Vds represents that the value used for the skew in the modeling operation 312 was initially inaccurate, and the comparison operation 322 exits to operation 324. In operation 324, the value used for the skew in the model is modified and the model re-generated in the operation 312. This loop between operations 312, 318, 322, and 324 continues until the horizontal mismatch between the generated Vds and measured Vds is below the minimum acquisition system skew threshold specified by the user or determined by the instrument. In some embodiments, the minimum acquisition system skew is 0.1 nS.

Also in the operation 322, the generated Vds and measured Vds are compared for a vertical mismatch. If the vertical mismatch is exceeded, the model initially incorrectly predicted either the power loop inductance or the filter order. Embodiments of the disclosure also included automated methods of determining values, as described below.

Returning back to FIG. 3, in the flow 300, when the instrument determines that both the horizontal and vertical mismatch is below threshold values in the operation 322, or if the user did not indicate an iterative process in the context panel 200 of FIG. 2A the flow 300 exits either of the decision operations 320 or 322 to another decision operation 326. If the skew amount determined by the flow 300 described above is not within hardware limits of the instrument, the decision operation 326 exits in the NO direction and an error message is conveyed to the user in an operation 328. In one embodiment the skew limit is 125 ns. If instead the decision operation 326 indicates the skew amount determined by the flow 300 is within hardware limits, the skew value is shown to the user in an operation 330 and is automatically set as the skew value used for testing in an operation 332. Further, if a CVR probe type was used to determine the skew, the flow 300 automatically scales the output of the waveform on the instrument based on the determined resistance value. This automatic rescaling removes the necessity of the user needing to remember to perform this step before further measurements are taken.

As mentioned above, one of the iterative operations performed by the flow 300 in FIG. 3 is to determine the effective inductance by comparing the measured and modeled Vds signals in the operation 318, comparing the vertical mismatch in the operation 322, adjusting the effective inductance parameter 314, and then using the updated parameter in generating the model in operation 312. A more detailed view of these operations is illustrated in the flowchart 700 in FIG. 7.

In FIG. 7, the operation 702 captures Vds, Id, and other circuit parameters, much like operations 304 and 306 of FIG. 3. Next, the DC bias is compared, and the model is updated as described above with reference to FIG. 5. Then, an operation 706 identifies turn-ON and turn-OFF regions of the devices being measured, much like operation 308 of FIG. 3, and the Vds is modeled in operation 712, much like was performed in operation 312.

The decision operation 716 compares the amount of vertical match between the modeled Vds and the measured Vds. Preferably these comparisons are performed using the modeled and measured versions of Vds low, but will be referred to as merely Vds, as various models and measurements could be used in different implementation embodiments without affecting the inventive concepts described herein. FIG. 8 illustrates how the effective inductance used to model Vds affects the outcome. As illustrated in FIG. 8, a display screen 800 shows the measured Vds 810, as well as two modeled Vds signals, 820, 830. The modeled Vds signal 820 shows the model outcome when the effective inductance L$_{eff}$ is originally chosen to be too low, while the modeled Vds signal 830 shows the model outcome when the effective inductance L$_{eff}$ is originally chosen to be too high. Thus, comparing the vertical difference of the modeled Vds to the measured Vds in the decision operation 716 (FIG. 7) informs the instrument whether the correct value for L$_{eff}$ was used for the model. If the modeled Vds vertically matches the measured Vds, the decision operation 716 exits in the YES direction and the L$_{eff}$ value is shown to the user. If instead the modeled Vds vertically does not match the measured Vds, the decision operation 716 exits in the NO direction to another decision operation 720.

The decision operation 720 compares the measured Vds to the modeled Vds. If the measured Vds is greater than the modeled Vds, then the L$_{eff}$ value is decreased by the step size provided by the user in the context panel 200 (FIG. 2A). For example, with reference to FIG. 8, if the modeled Vds appears like the modeled Vds signal 830, and is below the measured Vds 810, then the L$_{eff}$ value used by the model is too high, and the L$_{eff}$ value is decremented in an operation 722. If instead the modeled Vds signal appears like the modeled Vds signal 810, and is above the measured Vds 810, then the L$_{eff}$ value used by the model is too low, and the L$_{eff}$ value is incremented in an operation 724.

Like the iterative method of determining L$_{eff}$ described above, another value in the model may be iteratively determined. Specially, determining the order of the differential filter generally described in operation 316 of FIG. 3 may be determined using the operations illustrated in flow 900 of FIG. 9.

As background, the inductance characteristics of the DPT circuit, such as the testing setup 100 of FIG. 1 are included in L$_{eff}$ in Equation 3. A major contribution to voltage drops in the DPT circuit is due to inductance, since the current is rising rapidly during a turn-ON transient. So, accurately determining a rate of current change is useful for accurately modelling the voltage drop across the inductor, such as the inductor L of FIG. 1. The rate of current change is found using a central differential filter governed by equation 4 and can be expressed as shown in Equation 4a.

$$\frac{dI_d}{dt}(i) = \frac{I_d(i+h) - I_d(i-h)}{2h} \qquad (4a)$$

With reference to Equation 4a, the order of the differential filter is denoted by h. If the order of the filter is too small, high frequency components are introduced to the modeled Vas waveform. As the order increases, high frequency components are smoothened, leading to better modelling of waveform. If the filter order is too large, the transient nature of modeled waveform will be obscured. Effects of filter order are illustrated in FIGS. 10A, 10B, and 10C.

FIG. 10A illustrates a measured Vds 1010 as well as a modeled Vds 1020 using an accurate filter order. Note how the modeled Vds 1020 closely follows the measured Vds 1010. FIG. 10B shows an example flat model of Vds 1030 having a large differential order filter at the turn-ON transient, while FIG. 10C shows an example noisy model of Vds 1040 using a small differential order filter at the turn-ON transient.

Returning back to FIG. 9, the flow 900, which determines the proper order of the differential filter to use in the Vds models is illustrated. Several operations have been described above with reference to other flowcharts, such as capturing or measuring the Vds from the device in the DPT circuit as well as modeling the Vds, both shown in operation 902. And an operation 904 identifies the turn-ON and turn-OFF regions, also as described previously. Differently in the flow 900, however, is that operation 906 performs a Fast-Fourier Transform on the captured Vds signal, while an operation 910 performs a Fast-Fourier Transform on the modeled Vds signal. Then the transformed signals are compared to one another in the frequency domain in comparison operations 912 and 920.

If there is not a fundamental frequency match in the frequency domain between the two transformed signals, the filter order is decreased in an operation 914. Then the Vds is re-modeled in an operation 916 and transformed again in the operation 910. Then the updated, transformed, model signal having a lower filter order is again matched in the frequency domain to the transform of the measured Vds signal until the comparison operation 912 determines a match in the fundamental frequency. This process ensures that the filter order is started at a minimum possible value. Since the filter is a differential filter, this introduces high frequency components to the actual signal. FIG. 11 illustrates examples of how the high-frequency matching process determined in the comparison operation 920 affects the selection of the proper filter order. In FIG. 11, four separate signals are illustrated, all of which have been transformed into the frequency domain through FFT. The transformed, measured Vds signal, is illustrated as signal 1110. A transformed model having the correct filter is illustrated as signal 1120. Transforms of models being under filtered and over filtered are illustrated as signals 1130 and 1140, respectively. The difference in magnitude of FFT at higher frequencies are noticeable to naked eye with 0 dBm as reference in this case.

Returning back to FIG. 9, these higher frequencies are compared in the comparison operation 920. If they do not match, the filter order is increased in an operation 922, and the Vds re-modeled in the operation 916. This process repeats until the proper order filter is selected.

FIG. 12 is a block diagram illustrating a test and measurement system 90, which may also be referred to as a platform, having a test and measurement device 40 such as an oscilloscope or other test and measurement device. For ease of discussion, the device 40 may be referred to as a measurement device. Another part of the system 90 is a power and measurement device 50, which will be referred to as a power device for ease of discussion. These terms are not intended to limit the capabilities of either device, so no such limitation should be implied.

The measurement device 40 may have many different components, including a user interface 44 that allows a user to interact with various menus on the measurement device. The user interface 44 allows the user to make selections as to the tests to be run, set parameters, etc., such as through a display having a touch screen or various buttons and knobs. The measurement device 40 has one or more processors 46 that receive the user inputs and send the parameters and other selections to the measurement device and may receive output from the power device and generate outputs for the user from the data. The measurement device 40 includes a measurement unit 47 that performs tests and measures parameters of the DUT.

The term "processor" as used here means any electronic component or components that can receive an instruction and perform an action, such as one or more microcontrollers, field programmable gate arrays (FPGA), and/or application-specific integrated circuits (ASIC), as will be discussed in more detail further.

The measurement device 40 communicates with the power device 50 through a cable or other direct connection 48. The cable connects to each device through connection circuitry that allows the devices to switch configurations without having to re-cable.

The power device 50 may also have several different elements. These may include one or more processors 52, high voltage circuitry 56 that provides high voltage to the device under test (DUT), and an interlock 54 that acts as a protection for the high voltage circuitry. The interlock is designed to prevent device damage or any dangerous conditions resulting from the high voltage produced by the high voltage circuitry. A DUT interface 58 couples to an externally mounted DUT 70. The DUT 70 may actually include more than one separate device, depending on the testing configuration. The DUT interface 58 may be embodied by a universal DUT interface that allows the DUT 70 to connect to the various components in the power device 50. The power device 50 may also include a barrier 64 to protect the device 50 from the DUT 70.

High voltage circuitry within the power device 50 as well as the operation of the DUTs may generate heat, and/or the DUTs may need a particular temperature range to operate. The power device 50 may include temperature control circuitry 62 to control the temperature of the DUT 70. The one or more processors 52 monitor the temperature and operate the temperature control 62 which may comprise items such as fans, switchable heat sinks, cooling systems, heaters, etc. The power device 50 may also include a switching circuit 60, which controls operation of various components within the power device to test and measure the DUTs 70.

Generally, in operation, a user makes an input through the user interface 44, remotely or directly, to control operation of the power device 50 to characterize the DUT 70.

In general, the testing setup 100 described above with reference to FIG. 1 is housed within the power device 50, and more specifically within the switching circuit 60, although embodiments of the disclosure are not limited to such an example. Also, the probes described above, such as one or more voltage probes 68 and one or more current probes 69, may be coupled to the DUT 70 and are generally also coupled to the measurement device where measurements are made through the measurement unit 47. The automated de-skew procedure, effective inductance procedure, and proper filter order determination procedure described above are generally performed by the one or more processors 46 of the measurement device but could also partially or completely be performed by the one or more processors 52 of the power device 50.

In general, embodiments according to this disclosure provide increased instrument performance by automatically determining the correct amount of skew between measurement probes. In some embodiments it also determines the correct effective impedance, and the correct order of a differential filter. When a differential voltage probe is used, embodiments additionally automatically rescale the current waveform based on configured resistance value.

Also, whereas conventionally the skew between probes is computed before starting any measurement on test setup, in embodiments of the disclosure, the skew of the measurement system is performed after an acquisition of the measured waveforms. Further, the de-skew can be configured at each measurement level, so the user can decide whether to perform the de-skew for specific measurements, rather than performing a generic de-skew for all measurements.

The solutions described above are applicable for not just WBG signals, but also for IGBT and Si devices, so a wide range of power devices are supported.

In some embodiments, the overlapped statistical model, acquired Vas and Ia signals are shown on a display of a scope instrument as time domain waveforms at each iteration, so that the user may view the automatic setting of the skew, effective inductance, and the order of the differential filter as these values are being determined.

Further, in some embodiments, the final computed skew value is assigned to the specified channel. In some embodiments the user can save de-skewed waveforms for any further post processing.

In some embodiments, the step size value is linked to a General-Purpose Interface Bus (GPIB) knob A. By rotating the mouse wheel, the step size value can be increased or decreased. One advantage to this is that the user can easily see the updated de-skewed modelled $V_{ds}$ waveform on scope at each movement.

The foregoing description of the invention has been set merely to illustrate the invention and is not intended to be limiting. Since modifications of the disclosed embodiments incorporating the substance of the invention may occur to person skilled in the art, the invention should be construed to include everything within the scope of the invention.

EXAMPLES

Illustrative examples of the disclosed technologies are provided below. An embodiment of the technologies may include one or more, and any combination of, the examples described below.

Example 1 is a system for determining an amount of time skew between two measurement probes, the system including a first probe and a second probe, and one or more processors configured to measure a current signal from a Device Under Test (DUT) through the first probe, measure a voltage signal from the DUT through the second probe, generate a modeled voltage signal from the measured current signal, compare the modeled voltage signal to the measured voltage signal, determine the amount of time skew between the first and the second probe from the compared signals, set a skew value in the system to the determined amount of time skew, and display the skew value.

Example 2 is a system according to Example 1, in which the one or more processors are further configured to perform signal matching between the modeled voltage signal and the measured voltage signal.

Example 3 is a system according to any of the preceding Examples, in which the one or more processors are further configured to identify a common signal characteristic on both the modeled voltage signal and the measured voltage signal and measure a horizontal distance between the common signal characteristic on the modeled voltage signal.

Example 4 is a system according to Example 3, in which the one or more processors are further configured to modify a parameter used to generate the modeled voltage signal, generate a new modeled voltage signal using the modified parameter, and compare the new modeled voltage signal to the measured voltage signal.

Example 5 is a system according to Example 4, in which system repeatedly modifies the parameter, generates a new modeled voltage signal using the modified parameter, and compares the new modeled voltage signal to the measured voltage signal until a difference between the new modeled voltage signal and the measured voltage signal is below a skew threshold amount.

Example 6 is a system according to any of the previous Examples, in which the one or more processors are further configured to identify a common signal characteristic on both the modeled voltage signal and the measured voltage signal and measure a vertical distance between the common signal characteristic on the modeled voltage signal.

Example 7 is a system according to Example 6, in which the one or more processors are further configured to determine an amount of effective inductance in a DUT measuring circuit based on the vertical distance.

Example 8 is a system according to Example 7 in which determining the amount of effective inductance is determined iteratively.

Example 9 is a system according to Example 6, in which the one or more processors are further configured to iteratively determine an amount of slew rate of the DUT based on the vertical distance.

Example 10 is a system according to any of the preceding Examples, in which the one or more processors are further configured to perform a frequency transform on the measured voltage signal, perform a frequency transform on the modeled voltage signal, and compare the transforms in the frequency domain.

Example 11 is a system according to any of the preceding Examples, in which the one or more processors are further configured to simultaneously display the measured voltage signal and the modeled voltage signal to a user as the amount of time skew between the first and the second probe is being iteratively determined.

Example 12 is a system according to any of the preceding Examples, in which the first probe or the second probe includes a probe selected from the group of shunt resistor probe, hall effect probe, and Rogowski coil probe.

Example 13 is a system according to any of the preceding Examples, in which the DUT is an IGBT formed of SiC, GaN, GaN-HEMT, vertical GaN, and GaN-cascode.

Example 14 is a system according to any of the preceding Examples, in which parameters that control when the amount of time skew between the two measurement probes is determined are based on user preferences.

Example 15 is a system according to Example 14, in which the user preferences include a measured current threshold, probe parameters, effective inductance, and bias voltage.

Example 16 is a system according to any of the preceding Examples, in which the one or more processors are configured to iteratively determine the amount of time skew between the first and the second probe from the compared signals.

Example 17 is a method measuring a current signal from a Device Under Test (DUT) through the first probe, measuring a voltage signal from the DUT through the second probe, generating a modeled voltage signal from the measured current signal, comparing the modeled voltage signal to the measured voltage signal, determining the amount of time skew between the first and the second probe from the compared signals, setting a skew value in the system to the determined amount of time skew, and displaying the skew value.

Example 18 is a method according to Example 17, further including signal matching the modeled voltage signal to the measured voltage signal.

Example 19 is a method according to Example 17, further including identifying a common signal characteristic on both the modeled voltage signal and the measured voltage signal and measuring a horizontal distance between the common signal characteristic on the modeled voltage signal.

Example 20 is a method according to Example 19, further including modifying a parameter used to generate the modeled voltage signal, generating a new modeled voltage signal using the modified parameter, and comparing the new modeled voltage signal to the measured voltage signal.

Example 21 is a method according to Example 20, further including repeatedly modifying the parameter, generating a new modeled voltage signal using the modified parameter, and comparing the new modeled voltage signal to the measured voltage signal until a different between the new modeled voltage signal and the measured voltage signal is below a skew threshold amount.

Example 22 is a method according to any of the preceding Example methods, further including identifying a common signal characteristic on both the modeled voltage signal and the measured voltage signal and measuring a vertical distance between the common signal characteristic on the modeled voltage signal.

Example 23 is a method according to Example 22, further including determining an amount of effective inductance in a DUT measuring circuit based on the vertical distance.

Example 24 is a method according to Example 23, in which determining the amount of effective inductance is determined iteratively.

Example 25 is a method according to any of the preceding Example Methods, further including transforming the measured voltage signal from a time domain to a frequency domain, transforming the modeled voltage signal from the time domain to the frequency domain, and comparing the transforms in the frequency domain.

Example 26 is a method according to any of the preceding Example Methods, in which determining the amount of time skew between the first and the second probe from the compared signals is determined iteratively.

The previously described versions of the disclosed subject matter have many advantages that were either described or would be apparent to a person of ordinary skill. Even so, these advantages or features are not required in all versions of the disclosed apparatus, systems, or methods.

It should be appreciated by those skilled in the art that any block diagrams herein represent conceptual views of illustrative methods embodying the principles of the present disclosure. Similarly, it will be appreciated that any flow charts, flow diagrams, and the like represent various processes which may be substantially represented in computer readable medium and so executed by a computer or processor, whether or not such computer or processor is explicitly shown.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A system for determining an amount of time skew between two measurement probes, the system comprising:
   a first probe and a second probe coupled to a Device Under Test (DUT) having at least one semiconductor device; and
   one or more processors configured to:
      measure a current signal from the at least one semiconductor device of the DUT through the first probe,
      measure a voltage signal from the at least one semiconductor device of the DUT through the second probe,
      generate a modeled voltage signal from the measured current signal using the following formula:

$$V\_(\mathrm{ds\_low}) = V\_\mathrm{eb} - \left[\!\left[(I)\right]\!\right]\_\mathrm{d} * \mathrm{R\_probe}) - (L)_{\mathit{eff}} * \frac{dI_d}{dt}\right)$$

wherein $V_{ds\_low}$ is the modeled voltage signal, $V_{eb}$ is a constant bias voltage for the at least one semiconductor device of the DUT, $I_d$ is the current signal measured with the first probe, $R_{probe}$ is a resistance of the first probe, and $L_{eff}$ is an effective inductance,
      compare the modeled voltage signal to the measured voltage signal,
      determine the amount of time skew between the first and the second probe from the compared signals,
      set a skew value in the system to the determined amount of time skew, and display the skew value.

2. The system according to claim 1, in which the one or more processors are further configured to:
   generate an overlapping plot of the modeled voltage signal and the measured voltage signal.

3. The system according to claim 2, in which the one or more processors are further configured to:
   measure a horizontal distance between the modeled voltage signal and the measured voltage signal.

4. The system according to claim 3, in which the one or more processors are further configured to:
   modify a parameter used to generate the modeled voltage signal, in which the parameter includes one of probe resistance, bias voltage, differential order, and effective inductance,
   generate a new modeled voltage signal using the modified parameter, and
   compare the new modeled voltage signal to the measured voltage signal.

5. The system according to claim 4, in which system repeatedly modifies the parameter, generates a new modeled voltage signal using the modified parameter, and compares the new modeled voltage signal to the measured voltage signal until a difference between the new modeled voltage signal and the measured voltage signal is below a skew threshold amount.

6. The system according to claim 2, in which the one or more processors are further configured to:
   measure a vertical distance between the modeled voltage signal and the measured voltage signal.

7. The system according to claim 6, in which the one or more processors are further configured to determine an amount of effective inductance in a DUT measuring circuit coupled with the first and second probes based on the vertical distance.

8. The system according to claim 7, in which determining the amount of effective inductance is determined iteratively.

9. The system according to claim 1, in which the one or more processors are further configured to:
   perform a frequency transform on the measured voltage signal,
   perform a frequency transform on the modeled voltage signal, and
   compare the transforms in the frequency domain.

10. The system according to claim 1, in which the one or more processors are further configured to:
   simultaneously display the measured voltage signal and the modeled voltage signal to a user as the amount of time skew between the first and the second probe is being iteratively determined.

11. The system according to claim 1, in which the first probe or the second probe includes a probe selected from the group of shunt resistor probe, hall effect probe, and Rogowski coil probe.

12. The system according to claim 1, in which the at least one semiconductor device of the DUT is an IGBT formed of SiC, GaN, GaN-HEMT, vertical GaN, and GaN-cascode.

13. The system according to claim 1, in which the one or more processors are configured to iteratively determine the amount of time skew between the first and the second probe from the compared signals.

14. A method, comprising:
   measuring a current signal of at least one semiconductor device of a Device Under Test (DUT) through the first probe,
   measuring a voltage signal of the at least one semiconductor device of the DUT through the second probe,
   generating a modeled voltage signal from the measured current signal using the following formula:

$$V\_(\mathrm{ds\_low}) = V\_\mathrm{eb} - \left[\!\left[(I)\right]\!\right]\_\mathrm{d} * \mathrm{R\_probe}) - (L)_{\mathit{eff}} * \frac{dI_d}{dt}\right)$$

wherein $V_{ds\_low}$ is the modeled voltage signal, $V_{eb}$ is a constant bias voltage for the at least one semiconductor device of the DUT, $I_d$ is the current signal measured with the first probe, $R_{probe}$ is a resistance of the first probe, and $L_{eff}$ is an effective inductance,
   comparing the modeled voltage signal to the measured voltage signal, determining the amount of time skew between the first and the second probe from the compared signals,
   setting a skew value in the system to the determined amount of time skew, and
   displaying the skew value.

15. The method according to claim 14, further comprising generating an overlapping plot of the modeled voltage signal and the measured voltage signal.

16. The method according to claim 15, further comprising:
   measuring a horizontal distance between the modeled voltage signal and the measured voltage signal.

17. The method according to claim 16, further comprising:
   modifying a parameter used to generate the modeled voltage signal, in which the parameter includes one of probe resistance, bias voltage, differential order, and effective inductance, generating a new modeled voltage signal using the modified parameter, and comparing the new modeled voltage signal to the measured voltage signal.

18. The method according to claim 17, further comprising repeatedly modifying the parameter, generating a new modeled voltage signal using the modified parameter, and comparing the new modeled voltage signal to the measured voltage signal until a different between the new modeled voltage signal and the measured voltage signal is below a skew threshold amount.

19. The method according to claim 15, further comprising:

measuring a vertical distance between the modeled voltage signal and the measured voltage signal.

20. The method according to claim 19, further comprising determining an amount of effective inductance in a DUT measuring circuit coupled with the first and second probes based on the vertical distance.

21. The method according to claim 20, in which determining the amount of effective inductance is determined iteratively.

22. The method according to claim 14, further comprising:

transforming the measured voltage signal from a time domain to a frequency domain;

transforming the modeled voltage signal from the time domain to the frequency domain; and comparing the transforms in the frequency domain.

23. The method according to claim 14, in which determining the amount of time skew between the first and the second probe from the compared signals is determined iteratively.

* * * * *